United States Patent
Yamazaki et al.

(10) Patent No.: US 9,588,606 B2
(45) Date of Patent: Mar. 7, 2017

(54) TRANSPARENT CONDUCTIVE FILM AND MANUFACTURING METHOD THEREFOR

(75) Inventors: Yuka Yamazaki, Ibaraki (JP); Tomotake Nashiki, Ibaraki (JP); Hideo Sugawara, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 486 days.

(21) Appl. No.: 13/592,718

(22) Filed: Aug. 23, 2012

(65) Prior Publication Data
US 2013/0048348 A1    Feb. 28, 2013

(30) Foreign Application Priority Data
Aug. 24, 2011    (JP) .................................. 2011-182738

(51) Int. Cl.
*B32B 3/00* (2006.01)
*G06F 3/041* (2006.01)

(52) U.S. Cl.
CPC .... *G06F 3/041* (2013.01); *G06F 2203/04103* (2013.01); *Y10T 428/266* (2015.01)

(58) Field of Classification Search
CPC ............. G02F 1/133305; G02F 1/1335; G02F 1/13338; G02F 1/133345; G06F 3/0488; G06F 3/0416; G06F 3/041
(Continued)

(56) References Cited

U.S. PATENT DOCUMENTS

2002/0151161 A1    10/2002   Furusawa
2005/0045471 A1*    3/2005   Noguchi et al. ......... 204/192.26
(Continued)

FOREIGN PATENT DOCUMENTS

CN    1590086 A    3/2005
CN    101143498 A   3/2008
(Continued)

OTHER PUBLICATIONS

Korean Notice of Allowance dated Jul. 30, 2013, issued in corresponding Korean Patent Application No. 10-2012-0092212, w/English translation.
(Continued)

*Primary Examiner* — Humera Sheikh
*Assistant Examiner* — Seth Dumbris
(74) *Attorney, Agent, or Firm* — Westerman, Hattori, Daniels & Adrian, LLP

(57) ABSTRACT

The present invention is a transparent conductive film having a flexible transparent base and a transparent conductive layer made of a crystalline conductive metal oxide that is formed on one surface of the flexible transparent base, in which the thickness of the flexible transparent base is 80 μm or less, and the difference $H_1-H_2$ between the dimensional change rate $H_1$ when the transparent conductive film is heated at 140° C. for 30 minutes and the dimensional change rate $H_2$ when the transparent conductive layer is removed from the transparent conductive film by etching and the transparent conductive film is heated at 140° C. for 30 minutes is −0.02 to 0.043%. Because of that, the level difference at the pattern boundary when the film is assembled into a touch panel, etc. is decreased and the deterioration of the appearance can be also suppressed.

4 Claims, 3 Drawing Sheets

(58) Field of Classification Search
USPC .................. 349/12, 138, 158; 345/173, 176
See application file for complete search history.

(56) References Cited

U.S. PATENT DOCUMENTS

| | | | |
|---|---|---|---|
| 2008/0138589 A1 | 6/2008 | Wakabayashi et al. | |
| 2008/0176042 A1 | 7/2008 | Nashiki et al. | |
| 2008/0261030 A1 | 10/2008 | Nashiki et al. | |
| 2010/0015417 A1 | 1/2010 | Nakajima et al. | |
| 2010/0247810 A1* | 9/2010 | Yukinobu et al. | 428/1.4 |
| 2011/0135892 A1 | 6/2011 | Nashiki et al. | |
| 2011/0141059 A1 | 6/2011 | Nashiki et al. | |
| 2011/0143105 A1 | 6/2011 | Nashiki et al. | |
| 2011/0147340 A1 | 6/2011 | Nashiki et al. | |
| 2012/0012370 A1 | 1/2012 | Nashiki et al. | |
| 2013/0048348 A1 | 2/2013 | Yamazaki et al. | |

FOREIGN PATENT DOCUMENTS

| | | |
|---|---|---|
| CN | 101226450 A | 7/2008 |
| CN | 101842854 A | 9/2010 |
| EP | 1 947 551 A2 | 7/2008 |
| EP | 2 312 423 A2 | 4/2011 |
| EP | 2 312 424 A2 | 4/2011 |
| EP | 2 312 425 A2 | 4/2011 |
| EP | 2 312 426 A2 | 4/2011 |
| JP | 62-055127 A | 3/1987 |
| JP | 11-268168 A | 10/1999 |
| JP | 2002-164635 A | 6/2002 |
| JP | 2006-286308 A | 10/2006 |
| JP | 2008-098169 A | 4/2008 |
| JP | 2009-076432 A | 4/2009 |
| JP | 4364938 B1 | 11/2009 |
| JP | 2010-015861 A | 1/2010 |
| JP | 2010-021137 A | 1/2010 |
| JP | 2010-027294 A | 2/2010 |
| JP | 2011-116128 A | 6/2011 |
| KR | 101049182 B1 | 7/2011 |

OTHER PUBLICATIONS

Korean Notice of Allowance dated Jul. 17, 2013, issued in Korean Patent Application No. 10-2012-0092214 (corresponding to U.S. Appl. No. 14/041,549, and U.S. Appl. No. 13/393,858) with English translation (8 pages).
Korean Notice of Grounds for Rejection dated Mar. 31, 2014, issued in Korean Patent Application No. 2012-0092214 (corresponding to U.S. Appl. No. 14/041,549, and U.S. Appl. No. 13/393,858) with English Translation (8 pages).
Japanese Submission of Information dated Mar. 12, 2014, filed in Japanese Patent Application No. 2011-182733 (corresponding to U.S. Appl. No. 14/041,549, and U.S. Appl. No. 13/393,858) with English Translation (15 pages).
Taiwanese Office Action dated May 12, 2014, issued in Taiwanese Patent Application No. 101130156 (corresponding to U.S. Appl. No. 14/041,549, and U.S. Appl. No. 13/393,858), w/English translation (13 pages).
Chinese Office Action dated Sep. 2, 2014, issued in Chinese Patent Application No. 201210306567.2 (corresponding to U.S. Appl. No. 14/041,549, and U.S. Appl. No. 13/393,858), with English translation (17 pages).
Japanese Office Action dated Dec. 5, 2014, issued in Japanese Patent Application No. 2011-182733 (corresponding to U.S. Appl. No. 14/041,549, and U.S. Appl. No. 13/393,858) with English Translation (4 pages).
Korean Decision for Grant of Patent dated Jan. 28, 2015, issued in KR Patent Application No. 10-2012-0092214 (corresponding to U.S. Appl. No. 14/041,549, and U.S. Appl. No. 13/393,858) (2 pages).
Japanese Office Action dated Feb. 10, 2015, issued in corresponding JP Patent Application No. 2011-182738 with English translation (6 pages).
Taiwanese Office Action dated Mar. 24, 2015, issued in corresponding TW Patent Application No. 101130155 with English translation (9 pages).
US Office Action dated Mar. 14, 2014, issued in U.S. Appl. No. 14/041,549 (12 pages).
US Office Action dated Jul. 28, 2014, issued in U.S. Appl. No. 14/041,549 (12 pages).
US Office Action dated Dec. 4, 2014, issued in U.S. Appl. No. 14/041,549 (16 pages).
Chinese Office Action dated Sep. 18, 2014, issued in corresponding Chinese Patent Application No. 201210307081.0, w/English translation (16 pages).
Office Action dated Aug. 4, 2015, issued in counterpart Chinese Patent Application No. 201210307081.0, with English translation.
Notice of Allowance dated Jun. 23, 2015, issued in U.S. Appl. No. 14/041,549 (16 pages).
Office Action dated Dec. 18, 2015, issued in Japanese Patent Application No. 2015-018300 counterpart of U.S. Appl. No. 14/041,549, with English translation. (4 pages).
Office Action dated Mar. 8, 2016, issued in Japanese Patent Application No. 2015-018300 counterpart of U.S. Appl. No. 14/041,549, with English translation. (6 pages).
Notice of Allowance dated Apr. 12, 2016, issued in U.S. Appl. No. 14/041,549 (9 pages).
Office Action dated Mar. 30, 2016, issued in counterpart Chinese Patent Application No. 201210307081.0, with English translation. (15 pages).
Chinese Office Action dated Dec. 5, 2016, issued in corresponding Chinese Patent Application No. 201210307081.0, w/English translation (28 pages).

* cited by examiner

TRANSPARENT CONDUCTIVE FILM AND MANUFACTURING METHOD THEREFOR

BACKGROUND OF THE INVENTION

Field of the Invention

The present invention relates to a transparent conductive film having a transparent conductive layer on one surface of a flexible transparent base and a method of manufacturing it.

Description of the Related Art

A transparent conductive film that is used for a touch panel, etc. has been conventionally known in which a transparent conductive layer made of a conductive metal oxide such as ITO is laminated on a flexible transparent base such as a transparent film. In recent years, a projection capacitive touch panel in which a multipoint input (multi touch) is acceptable and a matrix resistive film type touch panel have been attracting attention. In these types of touch panels, a transparent conductive layer of the transparent conductive film is patterned into a prescribed shape such as a stripe shape. Such a transparent conductive film has a pattern forming part having a transparent conductive layer on a flexible transparent base and a pattern opening part having no transparent conductive layer on a flexible transparent base.

When the transparent conductive layer is patterned, the pattern may be visible and the appearance of the display element may become bad due to a difference in the reflectance between the part where the transparent conductive layer is formed (the pattern forming part) and the part where the transparent conductive layer is not formed (the pattern opening part). From the viewpoint of suppressing the difference of visibility due to the presence or absence of the transparent conductive layer, it has been proposed in JP-A-2010-15861, JP-A-2008-98169, JP-B1-4364938, and JP-A-2009-76432 that a plurality of dielectric layers are provided between the film base and the transparent conductive layer as an undercoat layer to adjust the refractive index of the dielectric layer, etc. in a prescribed range.

SUMMARY OF THE INVENTION

When the transparent conductive layer is patterned, it is required that its boundary is less apt to be visible. In addition to this, a thinner transparent conductive film that is used for a touch panel, etc. is required from the viewpoint of making the display device lighter and thinner. In order to decrease the thickness of the transparent conductive film, it is necessary to decrease the thickness of the film base that takes up most of the thickness of the transparent conductive film. However, from the investigation of the present inventors, it is found that, in the case of thin film base, the pattern boundary of the transparent conductive layer is easily visible and the appearance may become bad when the transparent conductive film is assembled into a touch panel even when dielectric layers are provided between the base and the transparent conductive layer. Especially when the conductive metal oxide of the transparent conductive layer is crystalline, the boundary between the pattern forming part and the pattern opening part tends to easily be visible.

In consideration of the above mentioned matters, an objective of the present invention is to provide a transparent conductive film in which the pattern of the transparent conductive layer is less apt to be visible when the transparent conductive film is assembled into a touch panel even in the case that the thickness of the base is small (80 μm or less).

As a result of the investigation of the present inventors, it is found that if the difference in the dimensional change rate between the pattern forming part and the pattern opening part is made to be small upon heating of the transparent conductive film, the pattern of the transparent conductive layer is less apt to be visible; and the present invention is completed.

The present invention relates to a transparent conductive film having a flexible transparent base and a transparent conductive layer made of a crystalline conductive metal oxide that is formed on one surface of the flexible transparent base. The thickness of the flexible transparent base is 80 μm or less. In the present invention, the difference $H_1-H_2$ between the dimensional change rate $H_1$ when the transparent conductive film is heated at 140° C. for 30 minutes and the dimensional change rate $H_2$ when the transparent conductive layer is removed from the transparent conductive film by etching and the transparent conductive film is heated at 140° C. for 30 minutes is −0.02 to 0.043%.

One embodiment of the present invention relates to a transparent conductive film that can be obtained by patterning the transparent conductive layer of the above-described transparent conductive film. In this embodiment, the transparent conductive layer is patterned, and the transparent conductive film has a pattern forming part having the transparent conductive layer on a flexible transparent base and a pattern opening part not having the transparent conductive layer on the flexible transparent base. A difference $h_1-h_2$ between the dimensional change rate $h_1$ of the pattern forming part and the dimensional change rate $h_2$ of the pattern opening part when the transparent conductive film is heated at 140° C. for 30 minutes is preferably −0.02 to 0.043%.

In one embodiment of the present invention, the transparent conductive layer is preferably made of crystalline tin-doped indium oxide. From the viewpoint of decreasing the difference in the reflectance of the pattern forming part and the pattern opening part to make the pattern of the transparent conductive layer less apt to be visible, the flexible transparent base preferably has at least one undercoat layer on the surface of the transparent film base where the transparent conductive layer is formed.

The present invention also relates to a method of manufacturing the transparent conductive film. One embodiment of the manufacturing method of the present invention has a step of preparing a base, a step of forming a film, and a step of anneal treatment. The step of preparing a base is a step of preparing a flexible transparent base. The step of forming a film is a step of forming an amorphous transparent conductive layer made of an amorphous conductive metal oxide on the flexible transparent base. The step of anneal treatment is a step of annealing the amorphous transparent conductive layer to be converted into a crystalline transparent conductive layer. In the manufacturing method of the present invention, the annealing temperature in the step of anneal treatment is preferably 70 to 140° C. The dimensional change rate in the step of heat treating is preferably 0 to −0.34%.

The present invention also relates to a method of manufacturing a transparent conductive film in which the transparent conductive layer is patterned to have a pattern forming part where the transparent conductive layer is on a flexible transparent base and a pattern opening part where the transparent conductive layer is not on the flexible transparent base. A part of the crystalline transparent conductive layer is removed by etching to pattern the transparent conductive layer.

In the transparent conductive film of the present invention, the difference between the dimensional change rate by heating when the transparent conductive layer is formed and the dimensional change rate by heating after the transparent conductive layer is removed is small. Because of that, the absolute value of the difference in the dimensional change rate by heating between the pattern forming part and the pattern opening part when the transparent conductive layer is patterned becomes small. Because the stress that occurs at the interface between the transparent conductive layer and the base of such a transparent conductive film is small even when the patterned transparent conductive layer is dried after the etchant is washed and when the film is heated to form a patterned wiring, waviness is hardly generated on the film. Because of that, the level difference is reduced at the pattern boundary and deterioration of the appearance due to the pattern boundary becoming visible is suppressed when the transparent conductive film is bonded to a stiff base body such as a glass plate to form a touch panel, etc.

DETAILED DESCRIPTION OF THE PREFERRED EMBODIMENTS

Figure 2:
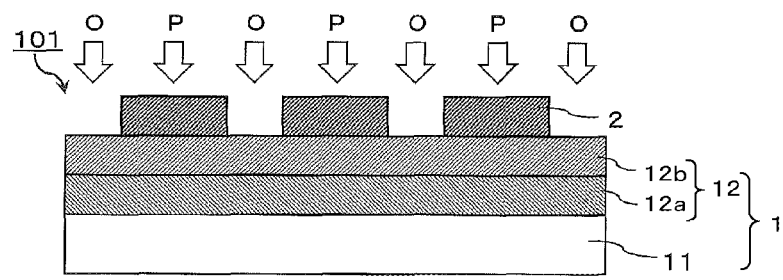
FIG. 2 is a schematic sectional view showing the transparent conductive film in which the transparent conductive layer is patterned.
Figure 3:
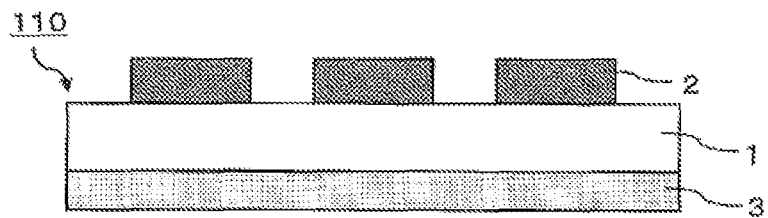
FIG. 3 is a sectional view showing one embodiment of the transparent conductive film with a pressure-sensitive adhesive layer.
Figure 4:
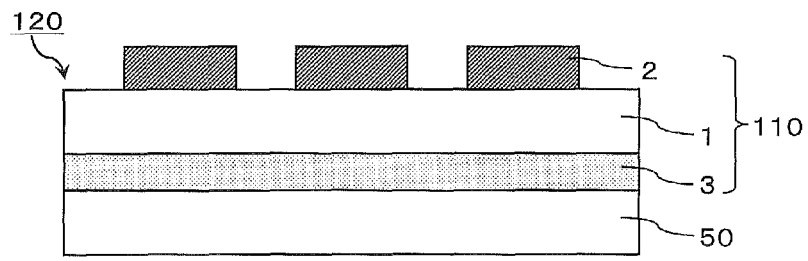
FIG. 4 is a schematic sectional view showing a configuration in which the transparent conductive film is bonded to another base body.

FIG. 2 is a schematic sectional view showing one embodiment of the transparent conductive film having a patterned transparent conductive layer. A transparent conductive film 101 shown in FIG. 2 has a patterned transparent conductive layer 2 on one surface of a flexible transparent base 1. In the flexible transparent base, an undercoat layer 12, etc. is formed on the surface of a transparent film base 11 as necessary. The transparent conductive film 101 includes a pattern forming part P where the transparent conductive layer 2 is formed and a pattern opening part O where the transparent conductive layer is not formed. FIG. 3 is a schematic sectional view showing one embodiment of the transparent conductive film with a pressure-sensitive adhesive layer having a pressure-sensitive adhesive layer 3 on the surface of the flexible transparent base 1 where the transparent conductive layer 2 is not formed. FIG. 4 is a schematic sectional view showing a configuration in which the transparent conductive film is bonded to a stiff base body 50 such as glass with the pressure-sensitive adhesive layer 3 interposed therebetween.

Figure 6:
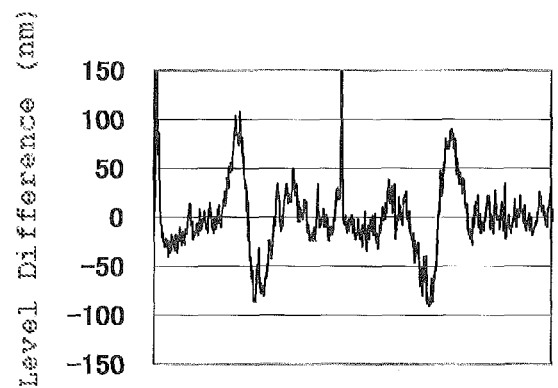
FIG. 6 is a drawing showing one example of a measurement result of a surface shape (the level difference) at the pattern boundary.

First, the inventors have investigated the cause of making the pattern boundary of the transparent conductive layer 2 of the transparent conductive film having the above-described configuration easily visible when the thickness of the flexible transparent base 1 is made small. One example of a profile of the surface shape of the side of the transparent conductive layer is shown in FIG. 6 when the transparent conductive film 101 in which the patterned transparent conductive layer 2 made of crystalline ITO is formed on the PET film base 11 having a thickness of 23 μm with the undercoat layer 12 interposed therebetween is bonded to a glass plate 50 with the pressure-sensitive adhesive layer 3 interposed therebetween. In FIG. 6, a height difference (a level difference) of 150 nm or more is generated at the boundary of the pattern forming part P where the transparent conductive layer is formed and the pattern opening part O where the transparent conductive layer is not formed. In this example, the height difference at the pattern boundary is larger by far than the thickness (20 nm) of the transparent conductive layer, and this level difference is considered to be a cause of making the pattern boundary easily visible.

Figure 7A:
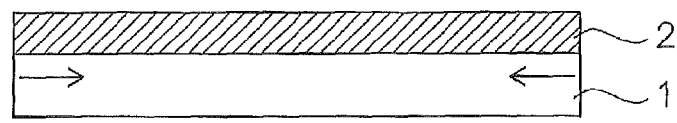
FIGS. 7A to 7C are drawings for conceptually explaining the generation of the level difference at the pattern boundary when the transparent conductive film is bonded to the base body.
Figure 7B:
Figure 7C:
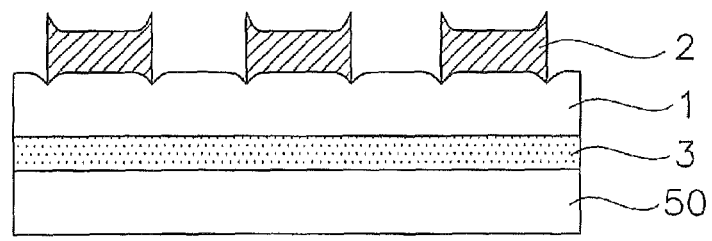

From further investigation of the cause of a large level difference being generated at the pattern boundary of the transparent conductive film that is bonded to a glass plate, it is found that waviness is generated with convex on the side of the pattern forming part P where the transparent conductive layer 2 is formed in the transparent conductive film before it is bonded to the glass plate as conceptually shown in FIG. 7B. When this wavy film is bonded to a flat glass plate with the pressure-sensitive adhesive layer interposed therebetween, the waviness of the film is almost relieved and becomes flat because the stiffness of the glass plate is larger than that of the film. When the waviness of the transparent conductive film is relieved and becomes flat, a strain is concentrated at the boundary part of the pattern forming part P that is curved convexly. Therefore, the transparent conductive layer is raised in the vicinity of the edge boundary, and this is estimated to be a cause of generating the level difference at the boundary as conceptually shown in FIG. 7C. In FIGS. 4 and 7C, a configuration is shown in which the side of the flexible transparent base 1 of the transparent conductive film 100 is bonded to the stiff base body 50 with the pressure-sensitive adhesive layer 3 interposed therebetween. However, it is considered that the level difference is generated at the pattern boundary due to the waviness of the film and the pattern boundary becomes easily visible even when the side of the transparent conductive layer 2 is bonded to the stiff base body.

It is considered that, in order to relieve the level difference to make the pattern boundary less apt to be visible, it is important to relieve the waviness of the transparent conductive film before it is bonded to a stiff base body such as glass. The cause of generating the waviness in the transparent conductive film has been further investigated, and it is found that the waviness can be easily generated when the transparent conductive layer is patterned by etching, etc. and when the film is heated after etching. In general, after the transparent conductive layer is patterned by etching, the etchant is washed, and then it is heated to be dried. The heating is also performed when a patterned wiring is formed on the transparent conductive film by silver paste, etc. to electrically connect the transparent conductive layer to an IC, etc.

The present invention is based on a proposed principle in which the level difference is decreased when the transparent conductive film is bonded to a stiff base body such as a glass plate and the pattern boundary is less apt to be visible when the generation of waviness is suppressed in the case that the transparent conductive layer is patterned or heated. As a result of further investigation, it is found that the generation of the waviness is suppressed when the dimensional change rates by heating of the pattern forming part and the pattern opening part are substantially equal to each other, and that the pattern boundary is less apt to be visible even when the film is bonded to glass, etc. In other words, the present invention is based on knowledge that the pattern boundary becomes less apt to be visible when the dimensional change by heating of the transparent conductive film in which the transparent conductive layer is formed on the base (corresponding to the pattern forming part) and the dimensional change by heating of the transparent conductive film when the transparent conductive layer is removed from the transparent conductive film (corresponding to the pattern opening part) are substantially equal to each other.

Figure 1:
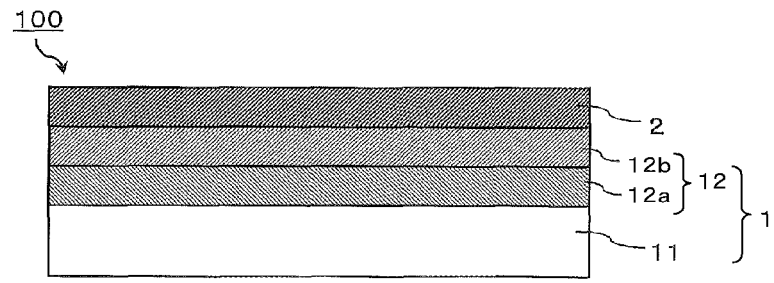
FIG. 1 is a schematic sectional view showing one embodiment of the transparent conductive film.

An embodiment of the present invention will be explained below by referring to the drawings. FIG. 1 is a schematic sectional view of the transparent conductive film according to one embodiment. The transparent conductive film 100 is shown in FIG. 1 in which the transparent conductive layer 2 is formed on the flexible transparent base 1 in which the undercoat layer 12 is formed on the transparent film base 11. As the flexible transparent base 1, one is shown in FIG. 1 that the undercoat layer 12 is formed on the film base 11; however, the flexible transparent base 1 may not have the undercoat layer. A functional layer (not shown in the drawings) such as a hard coat layer, a blocking preventing layer, and a reflection preventing layer, may be formed on the side of the film base 11 where the transparent conductive layer 2 is not formed.

<Flexible Transparent Base>
(Film Base)

The transparent film base 11 that configures the flexible transparent base 1 is not especially limited. However, various plastic films having transparency can be used. Examples of film materials include a polyester-based resin, an acetate-based resin, a polyethersulfone-based resin, a polycarbonate-based resin, a polyamide-based resin, a polyimide-based resin, a polyolefin-based resin, a (meth)acrylic-based resin, a polyvinyl chloride-based resin, a polyvinylidene chloride-based resin, a polystyrene-based resin, a polyvinyl alcohol-based resin, a polyarylate-based resin, and a polyphenylene sulfide-based resin. Among these, a polyester-based resin, a polycarbonate-based resin, and a polyolefin-based resin are especially preferable.

From the viewpoint that the waviness and the level difference are less apt to be generated on the transparent conductive film, it is preferable to make the thickness of the base film large to increase the stiffness. However, the thickness of the base film of the present invention is 80 μm or less from the viewpoint of making the film thinner. Even when the undercoat layer, etc. is formed on the film base 11 as described later, the thicknesses of these layers are far smaller than that of the film base. Because of that, when the thickness of the film base 11 is 80 μm or less, the thickness of the flexible transparent base is also 80 μm or less in general.

From the viewpoint of making the film thinner, the thickness of the film base is preferably small. However, when the thickness is excessively small, a problem occurs such as deterioration of handling properties. Therefore, the thickness of the film base is preferably 10 μm or more. The present invention is suitable even when the thickness of the film base is as thin as 10 to 60 μm and further 10 to 30 μm. When the film base 11 is made as thin as in the above-described range, the total thickness of the transparent conductive film becomes small. In addition, the amount of volatile components that are generated from the inside of the film base can be made small to form a transparent conductive layer having fewer defects when the transparent conductive layer 2 is formed by sputtering, etc.

The film base preferably has high dimensional stability during heating. The dimensional change is generally generated in a plastic film due to expansion or shrinkage when the film is heated. Contrary to this, a strain is generated at the interface between the flexible transparent base and the transparent conductive layer when the dimensional change is generated in the base film because the dimensional change of the transparent conductive layer made of a metal oxide is hardly generated. This causes generation of the waviness. Because of that, the base film preferably has a high thermal deformation temperature.

An etching treatment such as sputtering, corona discharge, blazing, ultraviolet ray irradiation, electron beam irradiation, chemical conversion, and oxidation and an undercoating treatment may be performed in advance on the surface of the transparent film base 11. With this, the adhesion of the transparent conductive layer 2 or the undercoat layer 12 that is formed on the transparent film base 11 to the film base 11 can be improved. Before the transparent conductive layer 2 or the undercoat layer 12 is provided, dust on the surface of the film base may be removed to clean the surface by cleaning with a solvent, ultrasonic waves, etc. as necessary.

The transparent film base 11 can be used as the flexible transparent base 1 as it is. However, a hard coat layer and a blocking preventing layer may be provided on the surface. From the viewpoint of making the pattern boundary less apt to be visible when the transparent conductive layer is patterned, the undercoat layer 12 is preferably formed on the surface of the transparent film base 11 where the transparent conductive layer is formed.

(Undercoat Layer)

The undercoat layer 12 can be formed of an inorganic substance, an organic substance, or a mixture of inorganic and organic substances. Examples of the inorganic substance include NaF (1.3), Na$_3$AlF$_6$ (1.35), LiF (1.36), MgF$_2$ (1.38), CaF$_2$ (1.4), BaF$_2$ (1.3), SiO$_2$ (1.46), LaF$_3$ (1.55), CeF$_3$ (1.63), and Al$_2$O$_3$ (1.63), where the number in the parentheses of each material is the refractive index. Among these, SiO$_2$, MgF$_2$, Al$_2$O$_3$, etc. can be preferably used. Especially, SiO$_2$ is suitable. Besides the above-described materials, a complex oxide containing about 10 to 40 parts by weight of cerium oxide and about 0 to 20 parts by weight of tin oxide to indium oxide can be used.

Examples of the organic substance include an acrylic resin, a urethane resin, a melamine resin, an alkyd resin, a siloxane-based polymer, and an organic silane condensate. At least one type of these organic substances can be used. Especially, a thermosetting type resin made of a mixture of a melamine resin, an alkyd resin, and an organic silane condensate is desirably used as the organic substance.

The undercoat layer 12 can be provided between the transparent film base 11 and the transparent conductive layer 2, and it does not function as a conductive layer. The undercoat layer is provided as a dielectric layer that insulates between the transparent film base 11 and the patterned transparent conductive layer 2. Therefore, the surface resistance of the undercoat layer is normally $1\times10^6 \Omega/\square$ or more, preferably $1\times10^7 \Omega/\square$ or more, and more preferably $1\times10^8 \Omega/\square$ or more. The upper limit of the surface resistance of the undercoat layer is not especially limited. The upper limit of the surface resistance of the undercoat layer is generally the measurement limit. It is about $1\times10^{13} \Omega/\square$. However, it may exceed $1\times10^{13} \Omega/\square$.

As a refractive index of the undercoat layer, it is preferable that the difference between the refractive index of the transparent conductive layer 2 and the refractive index of the undercoat layer 12 is 0.1 or more. The difference between the refractive index of the transparent conductive layer and the refractive index of the undercoat layer is preferably 0.1 to 0.9, and more preferably 0.1 to 0.6. The refractive index of the undercoat layer is normally 1.3 to 2.5, preferably 1.38 to 2.3, and more preferably 1.4 to 2.3.

The undercoat layer that is closest to the transparent film base 11 (an undercoat layer 12a in FIG. 1 for example) is preferably formed of an organic substance from the viewpoint of patterning the transparent conductive layer 2 by etching. Because of that, the undercoat layer 12 is preferably formed of an organic substance when the undercoat layer 12 consists of one layer.

When the undercoat layer 12 consists of two layers as shown in FIG. 1 or when it consists of three layers or more, the undercoat layer that is farthest from the transparent film base 11 (an undercoat layer 12 b in FIG. 1 for example) is at least preferably formed of an inorganic substance from the viewpoint of patterning the transparent conductive layer 2 by etching. When the undercoat layer 12 consists of three layers or more, the undercoat layers that are at the second layer or above from the film base 11 are preferably also formed of an inorganic substance.

The undercoat layer made of an inorganic substance can be formed by a dry process such as a vacuum vapor deposition method, a sputtering method, and an ion plating method; by a wet method (a coating method); etc. The inorganic substance that forms the undercoat layer is preferably $SiO_2$. A silica sol, etc. can be applied to form a $SiO_2$ film with a wet method.

When the undercoat layer 12 is provided, the first undercoat layer 12a is preferably formed of an organic substance and the second undercoat layer 12b is preferably formed of an inorganic substance.

The thickness of the undercoat layer is not especially limited. However, it is normally about 1 to 300 nm, and preferably 5 to 300 nm from respects of an optical design and an effect of preventing the generation of an oligomer from the transparent film base 11. When the undercoat layer 12 consists of two layers or more, the thickness of each layer is preferably about 5 to 250 nm, and more preferably 10 to 250 nm.

<Transparent Conductive Layer>

The transparent conductive layer 2 is formed of a crystalline conductive metal oxide. The conductive metal oxide that constitutes the transparent conductive layer is not especially limited, and a conductive metal oxide of at least one type of metal selected from the group consisting of indium, tin, zinc, gallium, antimony, titanium, silicon, zirconium, magnesium, aluminum, gold, silver, copper, palladium, and tungsten is used. The metal oxide may further contain metal atoms shown in the above-described group as necessary. For example, tin-doped indium oxide (ITO), antimony-doped tin oxide (ATO), etc. can be preferably used. Among these, ITO is most suitable. When the flexible transparent base 1 has the undercoat layer 12, the difference between the refractive index of the transparent conductive layer and that of the undercoat layer 12 is preferably 0.1 or more.

The thickness of the transparent conductive layer 2 is not especially limited. However, it is preferably 10 nm or more, more preferably 15 to 40 nm, and further preferably 20 to 30 nm. When the thickness of the transparent conductive layer is 15 nm or more, a good continuous film having a surface resistance of $1\times10^3 \Omega/\square$ or less can be easily obtained. When the thickness of the transparent conductive layer 2 is 40 nm or less, a layer having high transparency can be obtained.

The method of forming the transparent conductive layer 2 is not especially limited, and a conventionally known method can be adopted. Specific examples are a vacuum deposition method, a sputtering method, and an ion plating method. An appropriate method can be adopted depending on the film thickness that is necessary. As the transparent conductive layer, a crystalline film can be also formed as it is on the flexible transparent base 1 at high temperature. However, considering the heat resistance, etc. of the base, it is preferable that an amorphous film is formed on the base first, and the amorphous film is annealed and crystallized together with the flexible transparent base to form the crystalline transparent conductive layer.

In the present invention, the difference ($H_1-H_2$) between the dimensional change rate $H_1$ when the transparent conductive film is heated at 140° C. for 30 minutes and the dimensional change rate $H_2$ when the transparent conductive layer is removed from the transparent conductive film by etching and the transparent conductive film is heated at 140° C. for 30 minutes is preferably 0.02 to 0.043%. When the dimensional change rate is positive, it represents expansion; and when it is negative, it represents shrinkage. Therefore, a negative ($H_1-H_2$) means that the dimension of the base after the transparent conductive layer is removed is smaller than the dimension of the film on which the transparent conductive layer is formed (easily susceptible to thermal shrinkage).

Figure 5:
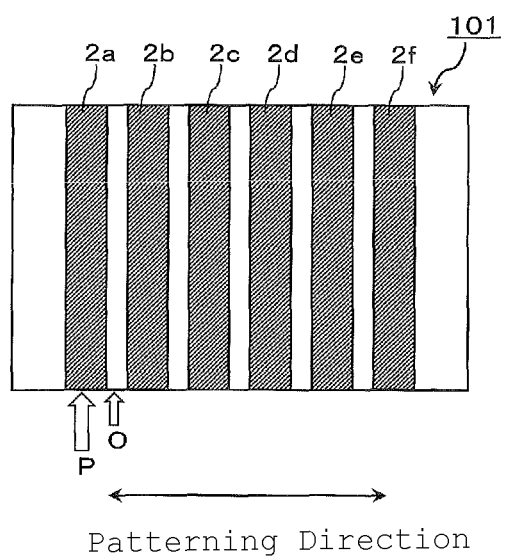
FIG. 5 is a schematic planar view showing one embodiment of the transparent conductive film in which the transparent conductive layer is patterned.

When the dimensional change rate (thermal shrinkage rate) of the transparent conductive film differs depending on direction, the dimensional change rate by heating in any one direction is preferably in the above-described range. As described later, the transparent conductive layer can be patterned to put the transparent conductive film of the present invention into practical use. However, when the transparent conductive layer is patterned in a stripe shape as shown in FIG. 5, the dimensional change rate by heating in a patterning direction (the direction in which the patterns are lined up) is preferably in the above-described range. The "dimensional change rate by heating" in the present specification is the change rate of the dimension in a prescribed direction before and after heating at 140° C. for 30 minutes unless otherwise noted, and the dimensional change rate (%) is defined by $100\times(L-L_o)/L_o$ where $L_o$ is a distance between two points in the film before heating and L is a distance between two points in the film after heating.

The generation of waviness upon heating is suppressed when the dimensional change rates by heating of the pattern forming part and the pattern opening part of the transparent conductive film in which the transparent conductive layer is patterned are substantially equal to each other, and the pattern boundary is less apt to be visible even when the film is bonded to glass, etc. The pattern forming part is a part where the crystalline transparent conductive layer is formed, and the pattern opening part is a part where the transparent conductive layer is removed by etching, etc. Therefore, when the dimensional change by heating of the transparent conductive film where the transparent conductive layer is formed and the dimensional change by heating upon removing the transparent conductive layer from the transparent conductive film are substantially equal to each other, the generation of waviness and a level difference is suppressed, and the pattern boundary becomes less apt to be visible.

A dimensional change may be easily generated in the flexible transparent base 1 after the transparent conductive layer 2 is removed when it is heated at about 140° C. When a biaxially stretched polyethylene terephthalate film is used as the transparent film base 11, thermal shrinkage is easily generated when it is heated at about 140° C., and $H_2$ becomes negative. On the other hand, the dimensional change rate by heating (an absolute value) of the crystalline transparent conductive layer is generally smaller than that of a plastic film. Because of that, the absolute value of the dimensional change rate by heating $H_1$ of the transparent conductive film where the crystalline transparent conductive layer 2 is formed on the flexible transparent base 1 is smaller than that of the dimensional change rate by heating $H_2$ of the flexible transparent base where the transparent conductive layer is removed.

When the crystalline transparent conductive layer 2 is formed, the dimensional change rate $H_1$ as the transparent conductive film is apparently small. However, when thermal deformation of the flexible transparent base 1 (the transparent film base 11) occurs, a stress is generated at the interface between the flexible transparent base 1 and the transparent conductive layer 2 due to the difference in the dimensional change rates as conceptually shown in FIG. 7A. When the transparent conductive layer 2 is patterned while the stress exists at the interface, the stress at the interface between the base and the transparent conductive layer is relieved at the pattern opening part where the transparent conductive layer is removed. On the other hand, the stress at the interface cannot be released at the pattern forming part where the transparent conductive layer is formed. Because of that, it is considered that waviness is generated in the film so that the transparent conductive layer 2 side of the pattern forming part becomes convex as conceptually shown in FIG. 7B.

Taking these into consideration, an absolute value of the difference ($H_1-H_2$) in the dimensional change rate by heating when the transparent conductive film is heated at 140° C. for 30 minutes is preferably small. The dimensional change by heating is generally small when the transparent conductive layer is formed. Contrary to this, thermal shrinkage generally easily occurs when the transparent conductive layer is removed. Because of that, the value of $H_1-H_2$ tends to be negative, and it is often +0.02% or less even if it is positive. When the value of $H_1-H_2$ is negative, its absolute value is preferably 0.043% or less, more preferably 0.035% or less, and further preferably 0.030% or less.

As described above, in order to make the absolute value of $H_1-H_2$ small, the external action that may cause the dimensional change of the flexible transparent base is preferably made small after the transparent conductive layer is formed on the flexible transparent base. Such external action is typically the thermal shrinkage of the base by heating. When the heat resistance of the base is considered, an amorphous film is formed on the base first, and the amorphous film is annealed and crystallized together with the base to form the crystalline transparent conductive layer. The annealing for crystallization easily causes the thermal shrinkage of the flexible transparent base. Therefore, this becomes the external action that causes the dimensional change of the flexible transparent base. When the base shrinks at the time of crystallization of the amorphous film, the transparent conductive layer is crystallized under the given compressive stress, so that a crystalline film having compressive residual stress is formed. Such residual compressive stress causes a strain at the interface between the transparent conductive layer and the flexible transparent base, and it is considered to be a cause of generating the waviness and the level difference. Because of that, the annealing conditions such that the thermal shrinkage of the base is minimally generated can be preferably selected when the amorphous film is crystallized in the present invention.

In order to make the thermal shrinkage that occurs in the base small, the annealing temperature in the anneal treatment step for crystallization can be preferably made small. on the other hand, when the annealing temperature in the anneal treatment step is excessively low, the crystallization may not proceed or may take a long time to crystallize, and the productivity tends to be deteriorated. The preferred annealing conditions can be appropriately selected based on the materials that constitute the flexible transparent conductive base and the transparent conductive layer and the thickness thereof.

The preferred embodiment is explained below in which an amorphous ITO film is formed on the flexible transparent base as the transparent conductive layer and then the amorphous ITO film is annealed and crystallized to form the transparent conductive layer made of crystalline ITO.

(Production of Amorphous Transparent Conductive Layer)

The amorphous ITO film is formed with a vapor deposition method. Examples of the vapor deposition method include an electron beam deposition method, a sputtering method, and an ion plating method. However, a sputtering method is preferable from the respect that a uniform thin film can be obtained, and a DC magnetron sputtering method can be suitably adopted. The "amorphous ITO" is not limited to ITO that is completely amorphous, and it can contain a small amount of crystal component. Whether ITO is amorphous or not is determined as follow: a laminated body in which an ITO film is formed on the base is soaked in hydrochloric acid having a concentration of 5 wt % at normal temperature for 15 minutes, washed with water, dried, and then the inter-terminal resistance between two points that are separated by 15 mm is measured with a tester. Because the amorphous ITO film is etched by hydrochloric acid and disappears, the resistance increases when it is soaked in hydrochloric acid. In the present specification, the conductive metal oxide film is determined to be amorphous when the 15 mm inter-terminal resistance exceeds 10 kΩ after it is soaked in hydrochloric acid, washed with water, and dried.

The amorphous ITO film that is formed on the flexible transparent base can be preferably crystallized even when it is annealed at relatively low temperature. Specifically, the crystallization of the amorphous ITO film can be completed preferably within 180 minutes, more preferably within 120 minutes, and further preferably within 90 minutes when it is annealed at 140° C. Further, the crystallization of the amorphous ITO film can be completed preferably within 900 minutes, more preferably within 600 minutes, and further preferably within 360 minutes when it is annealed at 100° C. Whether the crystallization of the ITO film is completed or not can be determined as follows: in the same way as the determination of the amorphous ITO, the film is soaked in hydrochloric acid, washed with water, dried, and then the 15 mm inter-terminal resistance is measured. When the inter-terminal resistance is 10 kΩ or less, it is determined that the amorphous ITO is converted to crystalline ITO.

The temperature and the time that are necessary for complete crystallization of the amorphous ITO film can be adjusted by controlling the type of the target that is used in sputtering, the ultimate vacuum during sputtering, the introduced gas flow rate, the temperature for forming a film (the substrate temperature), etc.

A metal target (an In—Sn target) or a metal oxide target (an $In_2O_3$—$SnO_2$ target) can be suitably used as the sputter target. The amount of Sn in the target is preferably 0.5 to 15% by weight relative to the added weight of In and Sn, more preferably 1 to 10% by weight, and further preferably 2 to 6% by weight. Because Sn that is not incorporated into the $In_2O_3$ crystal lattice works as an impurity, the crystallization of ITO tends to be inhibited. Because of that, the ITO film tends to be crystallized easier as the amount of Sn is smaller. On the other hand, when the amount of Sn is too small, the resistance of the ITO film after crystallization tends to be high. Therefore, the content of Sn is preferably in the above-described range.

For producing a film by sputtering using such a target, the sputtering device is preferably vented to vacuum (ultimate vacuum) of preferably $1\times10^{-3}$ Pa or less and more preferably $1\times10^{-4}$ Pa or less to achieve an atmosphere in which moisture and impurities such as organic gas that is generated from materials in the sputtering device are removed. The moisture and organic gas in the sputtering device terminate dangling bonds that are generated during sputtering and inhibit the crystal growth of ITO.

Then, an inert gas such as Ar is introduced in the vented sputtering device to produce a film by sputtering. When a metal target (an In—Sn target) is used as a sputter target, an oxygen gas that is a reactive gas is introduced with the inert gas to produce a film by sputtering. The introduced amount of oxygen to the inert gas is preferably 0.1 to 15% by volume and more preferably 0.1 to 10% by volume. The pressure during the film production is preferably 0.05 to 1.0 Pa and more preferably 0.1 to 0.7 Pa. When the pressure is too high, the speed of producing a film tends to decrease, and when the pressure is too low, the electric discharge tends to be unstable.

The substrate temperature during the film production by sputtering is preferably 40 to 190° C. and more preferably 80 to 180° C. When the temperature is too high, poor appearance due to thermal wrinkles and thermal deterioration of the base may occur. When the temperature is too low, the quality of the film such as transparency of the ITO film may decrease.

(Crystallization by Anneal Treatment)

The anneal treatment is performed on the obtained laminated body of the flexible transparent base 1 and the amorphous ITO film, and the amorphous ITO film is annealed to be converted into a crystalline ITO film. As described above, in order to decrease the absolute value of the difference $H_1-H_2$ in the dimensional change rate by heating before and after the crystalline ITO film is removed from the transparent conductive film, annealing conditions such that the thermal shrinkage of the base is minimally generated can be preferably selected.

In order to lower the thermal shrinkage that occurs in the base, the annealing temperature for crystallization is preferably made low. From the viewpoint of suppressing the thermal shrinkage of the base, a lower annealing temperature during crystallization is preferable. However, when the annealing temperature is too low, the crystallization may not proceed or may take a long time to crystallize, and the productivity tends to be deteriorated. From such a viewpoint, the annealing temperature is preferably 70 to 140° C., more preferably 70 to 130° C., and further preferably 70 to 110° C.

In the anneal treatment step to convert the amorphous ITO film into a crystalline ITO film, the dimensional change of the laminated body in which the ITO film is formed on the flexible transparent base is preferably 0 to −0.34%. The dimensional change (%) in the anneal treatment step for crystallization is defined by $100\times(D-D_o)/D_o$ when a distance $D_o$ between two points in one direction of the ITO film before the anneal treatment is changed to D after the anneal treatment. As described above, the dimensional change in the anneal treatment step is mainly caused by the dimensional change (thermal shrinkage) of the flexible transparent base. However, when the compressive stress is given to the transparent conductive layer due to the shrinkage of the base during crystallization, the transparent conductive layer after crystallization has a residual compressive stress, and a strain is generated at the interface between the base and the transparent conductive layer. In contrast, when the dimensional change during crystallization is in the above-described range, the stress is decreased at the interface between the transparent conductive layer and the flexible transparent base after crystallization. Because of that, the generation of waviness of the film is suppressed when the transparent conductive layer is patterned and also when the heating treatment is performed after patterning, and the level difference of the pattern boundary tends to become small when the patterned transparent conductive layer is bonded to a stiff base body such as a glass plate.

The obtained transparent conductive film can be used as transparent electrodes of various apparatuses as it is or to form a touch panel. However, apart of the transparent conductive layer 2 is preferably removed by etching, etc. to pattern the transparent conductive layer.

<Pattering of Transparent Conductive Layer>

The transparent conductive layer 2 of the transparent conductive film 101 schematically shown in FIG. 2 is patterned, and the transparent conductive film 101 includes the pattern forming part P where the transparent conductive layer 2 is formed and the pattern opening part O where the transparent conductive layer is not formed. The transparent conductive layer 2 is preferably patterned by etching. Various patterned shapes can be formed depending on the use to which the transparent conductive film is applied. Examples of the shape of the pattern forming part P include a stripe shape shown in FIG. 5 and a square shape. FIG. 5 shows that the width of the pattern forming part P is larger than that of the pattern opening part O. However, the present invention is not limited to this embodiment.

The transparent conductive layer 2 is preferably etched to pattern the transparent conductive layer 2. In the etching, apart (the pattern forming part) of the transparent conductive layer 2 is covered with a mask for forming a pattern, and a part of the transparent conductive layer that is not covered with the mask (the pattern opening part) is exposed to an etchant to be removed.

Because a conductive metal oxide such as ITO and ATO is suitably used for the transparent conductive layer 2, acid is used suitably for the etchant. Examples of the acid include inorganic acid such as hydrogen chloride, hydrogen bromide, sulfuric acid, nitric acid, and phosphoric acid, organic acid such as acetic acid, mixtures of these, and solutions of these.

In the present invention, the absolute value of the difference between the dimensional change rate by heating $H_1$ of the transparent conductive film before the transparent conductive layer is patterned and the dimensional change rate by heating $H_2$ in which the transparent conductive layer is removed from the transparent conductive film by etching is small. Because of that, when the transparent conductive layer is patterned, the absolute value of the difference $h_1-h_2$ between the dimensional change rate by heating $h_1$ of the pattern forming part P and the dimensional change rate by heating $h_2$ of the pattern opening part also becomes small. Because of that, even when the transparent conductive film is dried after the etchant is washed with water and even when the transparent conductive film is heated at the time of forming the patterned wiring, the generation of waviness that is caused by the difference between the dimensional change rates by heating of the pattern forming part P and the pattern opening part O can be suppressed, and deterioration of visibility due to the level difference of the pattern boundary when the film is assembled into a touch panel, etc. can be also suppressed.

The difference $h_1-h_2$ between the dimensional change rate by heating $h_1$ of the pattern forming part P and the dimensional change rate by heating $h_2$ of the pattern opening part O is preferably −0.043 to 0.02%. In the same way as $(H_1-H_2)$ that is described above, the value of $(h_1-h_2)$ tends to be negative, and it is +0.02% or less even if it is positive. When the value of $h_1-h_2$ is negative, its absolute value is preferably 0.043% or less, more preferably 0.035%0.035% or less, and further preferably 0.025%0.025% or less.

<Patterning of the Undercoat Layer>

When the transparent conductive layer 2 is patterned, the undercoat layer may be patterned in the same way. That is, when the flexible transparent base 1 has two or more undercoat layers, only the transparent conductive layer 2 can be patterned. Besides that, as shown in FIG. 2, after pattering of the transparent conductive layer 2, at least the undercoat layer 12b that is farthest from the transparent film base 11 may be patterned by etching, etc. in the same way as patterning the transparent conductive layer 2. From the viewpoint of making the pattern of the transparent conductive layer less apt to be visible, the undercoat layers other than the undercoat layer 12a that is the first layer from the transparent film base 11 are preferably patterned by etching in the same way as patterning the transparent conductive layer 2.

In the etching of the undercoat layer 12, the undercoat layer is covered with a mask for forming the same pattern as that of the transparent conductive layer, and a part of the undercoat layer that is not covered with the mask is removed by etching using an etchant. Because an inorganic substance such as $SiO_2$ is suitably used for the undercoat layers that are at the second layer or above from the transparent film base 11, alkali is suitably used as the etchant. Examples of alkali include solutions of sodium hydroxide, potassium hydroxide, ammonia, tetramethylammonium hydroxide, etc. and mixtures of these. When the undercoat layer 12b that is at the second layer or above is patterned by etching, the undercoat layer 12a of the first layer that is closest to the transparent film base 11 is preferably formed of an organic substance that cannot be etched by acid or alkali.

When the patterned transparent conductive layer 2 is provided with two or more undercoat layers interposed therebetween, the refractive index (n) and the thickness (d) of each layer, and a total of the optical index (n×d) of each layer are preferably as follows. With this, the difference of the reflectance between the pattern forming part P and the pattern opening part O can be designed to be small, and the pattern boundary becomes less apt to be visible.

For the undercoat layer 12a that is the first layer from the film base 11, the refractive index (n) is preferably 1.5 to 1.7, more preferably 1.5 to 1.65, and further preferably 1.5 to 1.6. The thickness (d) is preferably 5 to 220 nm, more preferably 5 to 150 nm, and further preferably 5 to 50 nm.

For the undercoat layer 12b that is the second layer from the film base 11, the refractive index (n) is preferably 1.4 to 1.5, more preferably 1.41 to 1.49, and further preferably 1.42 to 1.48. The thickness (d) is preferably 5 to 80 nm, more preferably 5 to 65 nm, and further preferably 5 to 50 nm.

For the transparent conductive layer 2, the refractive index (n) is preferably 1.9 to 2.1, more preferably 1.9 to 2.05, and further preferably 1.9 to 2.0. The thickness (d) is preferably 15 to 30 nm, more preferably 15 to 28 nm, and further preferably 15 to 25 nm.

The total of optical thicknesses (n×d) of the respective layers (the first undercoat layer 12a, the second undercoat layer 12b, and the transparent conductive layer 2) is preferably 15 to 483 nm, more preferably 30 to 400 nm, and further preferably 30 to 350 nm.

A difference (Δnd) between the total optical thickness of the undercoat layer of the pattern forming part P and the transparent conductive layer and the optical thickness of the undercoat layer of the pattern opening part O is preferably 40 to 130 nm, more preferably 40 to 120 nm, and further preferably 40 to 110 nm.

The transparent conductive film in which the transparent conductive layer 2 is patterned can be suitably used in a touch panel, etc. Because the transparent conductive layer is patterned to have a plurality of transparent electrodes, it is suitably used in a projection capacitive touch panel and a matrix resistive film type touch panel. When the film is applied to a touch panel, etc., a transparent conductive film with a pressure-sensitive adhesive layer may be formed as shown in FIG. 3 that has the pressure-sensitive adhesive layer 3 on the surface of the flexible transparent base 1 where the transparent conductive layer 2 is not formed. The transparent conductive film with a pressure-sensitive adhesive layer is bonded to the base body 50 with the pressure-sensitive adhesive layer 3 interposed therebetween as shown in FIG. 4. Even when a stiff base body such as a glass plate is used as the base body 50, the generation of the level difference at the pattern boundary is suppressed and a touch panel with excellent visibility can be formed if the waviness of the transparent conductive film is suppressed. When the pressure-sensitive adhesive layer is provided on the side where the transparent conductive layer 2 is provided and then it is bonded to another base body such as a window layer of the touch panel, the level difference at the pattern boundary is also suppressed. Therefore, a touch panel with excellent visibility can be also formed.

The pressure-sensitive adhesive layer 3 can be used without special limitation as long as it has transparency. Specifically, layers having an acrylic-based polymer, a silicone-based polymer, polyester, polyurethane, polyamide, polyvinylether, a vinylacetate/vinylchloride copolymer, modified polyolefin, an epoxy-based polymer, a fluoro-based polymer, and a rubber-based polymer such as natural rubber and synthetic rubber as a base polymer can be appropriately selected and used. Especially, an acrylic pressure-sensitive adhesive can be preferably used from the respects that it has excellent optical transparency, it exhibits moderate wettability, cohesivity, and adhesion characteristics such as tackiness, and it has excellent weather resistance, heat resistance, etc.

There are some pressure-sensitive adhesives of which anchoring power to the base can be improved by using an appropriate undercoating agent for adhesion depending on the type of the pressure-sensitive adhesive that is a constituting material of the pressure-sensitive adhesive layer 3.

Therefore, when such a pressure-sensitive adhesive is used, an undercoating agent for adhesion is preferably used on the flexible transparent base 1.

A crosslinking agent according to the base polymer can be contained in the pressure-sensitive adhesive layer. Appropriate additives can be compounded in the pressure-sensitive adhesive layer such as a filler made of natural and synthetic resins, glass fibers, glass beads, metal powder, and other inorganic powder, a pigment, a coloring agent, and an antioxidant as necessary. Transparent particles can be contained to give optical diffusivity to the pressure-sensitive adhesive layer 3.

The pressure-sensitive adhesive layer is used as a pressure-sensitive adhesive solution having a concentration of solid content of about 10 to 50% by weight in which the base polymer or its composition is dissolved or dispersed in a solvent. An organic solvent such as toluene and ethylacetate, water, etc. can be appropriately selected and used as the solvent according to the type of the pressure-sensitive adhesive.

After this pressure-sensitive adhesive layer is adhered to a stiff base body such as glass or other plastic films, it can have a function of improving the scratch resistance, and tap properties for a touch panel, so-called pen input durability and surface pressure durability, in the transparent conductive layer 2 provided on one surface of the base 1 due to its cushioning effect. Because of that, the cushioning effect is preferably given to the pressure-sensitive adhesive layer especially when it is used in a matrix resistive film type touch panel. Specifically, the elastic modulus of the pressure-sensitive adhesive layer 3 is desirably set in a range of 1 to 100 N/cm$^2$, and the thickness is desirably set to 1 μm or more, normally in a range of 5 to 100 μm. When the thickness of the pressure-sensitive adhesive layer is in the above-described range, the cushioning effect can be sufficiently exhibited, and adhesive power by the pressure-sensitive adhesive layer can be also sufficient. When the thickness of the pressure-sensitive adhesive layer is smaller than the above-described range, the above-described durability and the adhesion cannot be sufficiently secured, and when it is larger than the above-described range, problems may occur in the outer appearance such as transparency. When the transparent conductive film is used in a capacitive touch panel, the cushioning effect by the pressure-sensitive adhesive layer is not necessarily desired. However, the pressure-sensitive adhesive layer 3 preferably has the same thickness and elastic modulus as described above from the viewpoints of the adhesion to various bases and facilitating handling of the transparent conductive film with a pressure-sensitive adhesive layer.

EXAMPLES

The present invention will be explained in detail using examples below. However, the present invention is not limited to the following examples as long as it does not exceed its gist. In the following examples, a measurement was performed on a film having a thickness of 1 μm or more with a microgauge type thickness meter manufactured by Mitutoyo Corporation. The thicknesses of the undercoat layer and the ITO film were calculated by fitting peak intensities of a Si atom and an In atom to a calibration curve using an x-ray fluorescence analyzer ZSX100e manufactured by Rigaku Corporation.

Example 1

Formation of Undercoat Layer

A biaxially stretched polyethylene terephthalate (PET) film (trade name "DIAFOIL" manufactured by Mitsubishi Plastics, Inc., glass transition temperature 80° C., refractive index 1.66) having a thickness of 23 μm was used as a transparent film base, and an undercoat layer was formed on this PET film.

First, a thermosetting type resin composition containing a melamine resin:an alkyd resin:an organic silane condensate at weight ratio of 2:2:1 in solid content was diluted with methylethylketone so that the concentration of solid content became 8% by weight. This solution was applied on the main surface of the PET film, and it was heated at 150° C. for 2 minutes and cured to form a first undercoat layer having a thickness of 50 nm and a refractive index of 1.54. Then, a siloxane thermosetting type resin ("Colcoat" P manufactured by Colcoat Co., Ltd.) was diluted with methylethylketone so that the concentration of solid content became 1% by weight, this solution was applied onto the first undercoat layer, and it was heated at 150° C. for 1 minute and cured to form a SiO$_2$ thin film (a second undercoat layer) having a thickness of 30 nm and a refractive index of 1.45.

(Production of Amorphous ITO Film)

A sintered body containing indium oxide and tin oxide at a weight ratio of 97:3 was mounted in a parallel plate winding type magnetron sputtering apparatus as a target material. The dehydration and degassing were performed while transporting the PET film base on which two undercoat layers were formed and the apparatus was vented to 5×10$^{-3}$ Pa. Under such conditions, while the heating temperature of the base was made to be 120° C. and argon gas and oxygen gas were introduced at a flow rate of 98%:2% so that the pressure became 4×10$^{-1}$ Pa, an amorphous ITO film having a thickness of 20 nm was formed on the base with a DC sputtering method.

(Crystallization of ITO Film)

A piece of 300 mm square was cut out from the laminated body in which the amorphous ITO film was formed on the flexible transparent base, and it was annealed for 9600 minutes in a dry oven set to 80° C. to crystallize the ITO film. The completion of the crystallization of the ITO film was confirmed from the resistance value after it was soaked in hydrochloric acid.

(Evaluation of Dimensional Change During Crystallization)

A strip-shaped test piece of 100 mm×10 mm having the direction of the feeding of the base (MD direction) as the long side was cut out from the laminated body before crystallization in which the amorphous ITO film was formed on the flexible transparent base, two target points (scratches) were formed at an interval of about 80 mm in the direction of the feeding (hereinafter "MD direction") during the production of the film by sputtering. Then, the ITO film was crystallized at the same annealing temperature and time as described above. The distance between target points $L_o$ before the crystallization by annealing and the distance between target points L after annealing were measured with a two-dimensional length measuring machine to obtain a dimensional change at crystallization=100×(L−$L_o$)/$L_o$ (%).

(Evaluation of Dimensional Change Rate by Heating of Transparent Conductive Film)

A strip-shaped test piece of 100 mm×10 mm having the MD direction as the long side was cut out from the transparent conductive film after crystallization of the ITO film, and two target points (scratches) were formed at an interval of about 80 mm on the ITO film. Then, the heat treatment was performed at 140° C. for 30 minutes to obtain the dimensional change rate by heating $H_1$ from the distances between target points before and after heating in the same way as described above.

(Evaluation of Dimensional Change Rate by Heating after Transparent Conductive Layer is Removed)

A strip-shaped test piece of 100 mm×10 mm having the MD direction as the long side was cut out from the transparent conductive film after crystallization of the ITO film, and this test piece was soaked in a 10 wt % hydrochloric acid solution heated to 50° C. for 5 minutes to perform an etching treatment on the transparent conductive layer. The test piece in which the transparent conductive layer was removed was washed by soaking it in a sufficient amount of pure water, and then it was placed in an atmosphere of temperature 23° C. and humidity 55% for 24 hours and dried. Then, two target points (scratches) were formed at an interval of about 80 mm on the film surface, and the heat treatment was performed at 140° C. for 30 minutes to obtain the dimensional change rate by heating $H_2$ from the distances between target points before and after heating in the same way as described above.

(Patterning of ITO Film and Evaluation of Level Difference)

A rectangular-shaped test piece of 60 mm×50 mm having the MD direction as the long side was cut out from the transparent conductive film after crystallization of the ITO film, and a plurality of polyimide tapes of 2 mm wide were bonded onto the surface of the ITO film at an interval of 2 mm. At this time, the tapes were bonded in the direction (hereinafter "TD direction") perpendicular to the MD direction so that the MD direction became a patterning direction. This test piece was soaked in a 10 wt % hydrochloric acid solution heated to 50° C. for 5 minutes to perform an etching treatment on the non-masking part (the part where the polyimide tapes were not bonded) of the transparent conductive layer. The test piece in which the transparent conductive layer was removed was washed by soaking it in a sufficient amount of pure water, the polyimide tapes were slowly peeled off, and it was heated at 140° C. for 30 minutes and dried.

The obtained test piece in which the ITO film was patterned was bonded to a glass plate with an acrylic-based pressure-sensitive adhesive layer of 23 μm thick interposed therebetween using a hand roller with the ITO film face up. The surface of the sample where ITO film was formed was scanned at a cutoff value of 0.8 mm and a speed of 0.2 mm/sec using a fine shape measuring machine (model "ET4000") manufactured by Kosaka Laboratory, Ltd. to measure the level difference at the boundary between the pattern forming part where the transparent conductive layer was formed and the pattern opening part where the transparent conductive layer was removed. Whether it was possible to distinguish the pattern forming part and the pattern opening part or not was visibly evaluated. The visual distance was 20 cm, and the visual angle was 40 degrees from the surface of the sample.

Examples 2, 3, and 5 to 7, and Comparative Examples 1 to 5, 7, and 8

An amorphous ITO film was formed on the flexible transparent base in the same way as Example 1, and then the ITO film was crystallized at the temperature and conditions shown in Table 1. The ITO film was patterned and various evaluations were performed in the same way as Example 1.

Example 4 and Comparative Example 6

An amorphous ITO film was formed on the flexible transparent base and the ITO film was crystallized in the same way as Example 1. However, in Example 4 and Comparative Example 6, the ITO film was crystallized at the temperature and conditions shown in Table 1, and a strip-shaped test piece having the TD direction as the long side was cut out to measure the dimensional change rate in the TD direction for the evaluations of the dimensional change at crystallization and the dimensional change rate by heating of the transparent conductive film. Polyimide tapes were bonded for masking so that the TD direction became a patterning direction, and the transparent conductive layer was patterned by etching in the patterning of the ITO film and the evaluation of the level difference.

The conditions of producing the transparent conductive film and the evaluation results of each example and comparative example are shown in Table 1. For visual evaluation of the pattern, results based on the following 4 grades are shown.

⊚: The pattern forming part and the pattern opening part can hardly be distinguished.

◯: The pattern forming part and the pattern opening part can be slightly distinguished.

Δ: The pattern forming part and the pattern opening part can be distinguished.

x: The pattern forming part and the pattern opening part can be clearly distinguished.

TABLE 1

| | Base | | Anneal treatment Conditions | | | Dimensional Change at | | Evaluation | |
|---|---|---|---|---|---|---|---|---|---|
| | Type | Thickness (μm) | Temperature (° C.) | Time (min) | Patterning Direction | Crystallization (%) | $H_1 - H_2$ (%) | Level Difference (nm) | Visual Evaluation |
| Example 1 | PET | 23 | 80 | 9600 | MD | −0.053 | 0.000 | 70 | ⊚ |
| Example 2 | PET | 23 | 100 | 720 | MD | −0.150 | −0.030 | 114 | ◯ |
| Example 3 | PET | 23 | 110 | 420 | MD | −0.020 | −0.022 | 95 | ◯ |
| Example 4 | PET | 23 | 110 | 420 | TD | −0.160 | −0.032 | 125 | ◯ |
| Example 5 | PET | 23 | 120 | 180 | MD | −0.180 | −0.038 | 168 | Δ |
| Example 6 | PET | 23 | 130 | 120 | MD | −0.289 | −0.039 | 165 | Δ |
| Example 7 | PET | 50 | 140 | 90 | MD | −0.327 | −0.009 | 52 | ⊚ |
| Comparative Example 1 | PET | 23 | 140 | 90 | MD | −0.350 | −0.045 | 175 | X |
| Comparative Example 2 | PET | 23 | 150 | 60 | MD | −0.417 | −0.044 | 193 | X |

TABLE 1-continued

| | Base | | Anneal treatment Conditions | | | Dimensional Change at | | Evaluation | |
|---|---|---|---|---|---|---|---|---|---|
| | Type | Thickness (μm) | Temperature (° C.) | Time (min) | Patterning Direction | Crystallization (%) | $H_1 - H_2$ (%) | Level Difference (nm) | Visual Evaluation |
| Comparative Example 3 | PET | 23 | 160 | 60 | MD | −0.595 | −0.049 | 216 | X |
| Comparative Example 4 | PET | 23 | 170 | 30 | MD | −0.600 | −0.047 | 224 | X |
| Comparative Example 5 | PET | 23 | 180 | 10 | MD | −0.737 | −0.048 | 258 | X |
| Comparative Example 6 | PET | 23 | 180 | 10 | TD | −0.737 | −0.050 | 230 | X |
| Comparative Example 7 | PET | 23 | 190 | 10 | MD | −1.265 | −0.051 | 289 | X |
| Comparative Example 8 | PET | 23 | 200 | 5 | MD | −1.350 | −0.051 | 357 | X |

Figure 8:
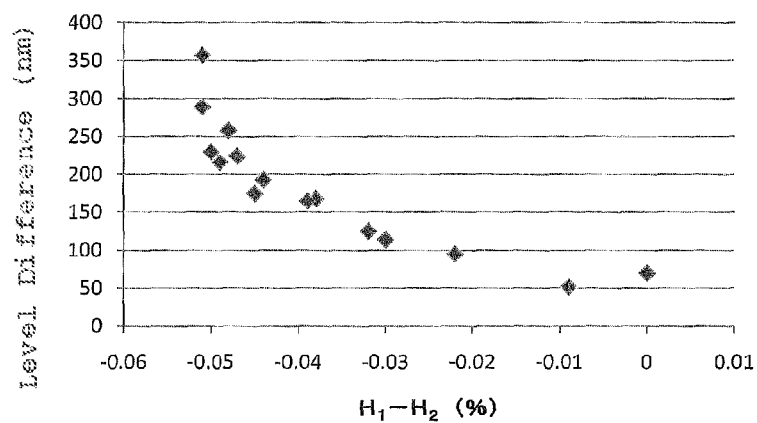
FIG. 8 is a plot showing the relationship between the value of $(H_1-H_2)$ and the level difference at the pattern boundary in the examples and comparative examples.

As seen from Table 1, the smaller the level difference is at the pattern boundary, the more difficult the pattern boundary is to be visual. FIG. 8 is a plot of the level difference of the pattern boundary to $H_1-H_2$ of each example and comparative example. According to FIG. 8, it is found that the level difference becomes larger as the absolute value of $H_1-H_2$ becomes larger, and the value of $H_1-H_2$ has a high correlation with the level difference regardless of the type and the thickness of the base and the patterning direction of the transparent conducive layer. Therefore, the level difference is decreased and the pattern boundary becomes less apt to be visible when $H_1-H_2$ is set in a prescribed range.

When the respective examples and comparative examples are compared, it is found that the absolute value of $H_1-H_2$ is small and the level difference is suppressed as the heating temperature in the heat treatment step for crystallization becomes smaller. On the other hand, because the speed of crystallization of a conductive metal oxide follows the Arrhenius equation, the time that is necessary for the heat treatment becomes exponentially large as the heating temperature becomes low. Although it is not shown in Table 1, the time that is necessary for crystallization was about 2100 minutes when the temperature for the heat treatment was 90° C. From this, it can be found that, when the temperature for the crystallization by heating is made high within the limit that the pattern boundary is not visible, a transparent conductive film in which the pattern boundary is less apt to be visible can be obtained without considerably deteriorating the productivity even in the case that the transparent conductive layer is patterned.

What is claimed is:

1. A transparent conductive film having a flexible transparent base and a transparent conductive layer made of a crystalline conductive metal oxide that is formed on one surface of the flexible transparent base, wherein
the transparent conductive layer is formed by a sputtering method,
the thickness of the flexible transparent base is 80 μm or less, and
the difference $H_1-H_2$ between the dimensional change rate $H_1$ when the transparent conductive film is heated at 140° C. for 30 minutes and the dimensional change rate $H_2$ when the transparent conductive layer is removed from the transparent conductive film by etching and the transparent conductive film is heated at 140° C. for 30 minutes is −0.043 to 0.02%,
a thickness of the transparent conductive layer is 10 to 30 nm,
the flexible transparent base has a transparent film base,
the transparent conductive film has at least one undercoat layer provided between the transparent film base and the transparent conductive layer,
the undercoat layer is formed of an inorganic substance, an organic substance, or a mixture of inorganic and organic substances,
the transparent conductive layer is patterned and is bonded to a glass plate with an acrylic-based pressure-sensitive adhesive layer,
wherein a level difference at a boundary between a pattern forming part where the transparent conductive layer is formed and a pattern opening part where the transparent conductive layer is removed is 52-168 nm.

2. A transparent conductive film having a flexible transparent base and a transparent conductive layer made of a crystalline conductive metal oxide that is formed on one surface of the flexible transparent base, wherein
the transparent conductive layer is patterned, and the transparent conductive film has a pattern forming part where the transparent conductive layer is on a flexible transparent base and a pattern opening part where the transparent conductive layer is not on the flexible transparent base,
the transparent conductive layer is formed by a sputtering method,
the thickness of the flexible transparent base is 80 μm or less, and
the difference $h_1-h_2$ between the dimensional change rate $h_1$ of the pattern forming part and the dimensional change rate $h_2$ of the pattern opening part when the transparent conductive film is heated at 140° C. for 30 minutes is −0.043 to 0.02%,
a thickness of the transparent conductive layer is 10 to 30 nm,
the transparent conductive film has at least one undercoat layer provided between the transparent film base and the transparent conductive layer, and
the undercoat layer is formed of an inorganic substance, an organic substance, or a mixture of inorganic and organic substances, and
the transparent conductive layer is bonded to a glass plate with an acrylic-based pressure-sensitive adhesive layer,
wherein a level difference at a boundary between the pattern forming part where the transparent conductive layer is formed and the pattern opening part where the transparent conductive layer is 52-168 nm.

3. The transparent conductive film according to claim 1 or 2, wherein the transparent conductive layer is made of crystalline tin-doped indium oxide.

4. The transparent conductive film according to claim 1 or 2, wherein the at least one undercoat layer on the surface of the transparent film base where the transparent conductive layer is formed.

* * * * *